(12) United States Patent
Copel et al.

(10) Patent No.: US 10,748,059 B2
(45) Date of Patent: Aug. 18, 2020

(54) ARCHITECTURE FOR AN ELECTROCHEMICAL ARTIFICIAL NEURAL NETWORK

(71) Applicant: International Business Machines Corporation, Armonk, NY (US)

(72) Inventors: Matthew Warren Copel, Yorktown Heights, NY (US); James Bowler Hannon, Lake Lincolndale, NY (US); Satoshi Oida, Yorktown Heights, NY (US); John Jacob Yurkas, Stamford, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 698 days.

(21) Appl. No.: 15/479,814

(22) Filed: Apr. 5, 2017

(65) Prior Publication Data

US 2018/0293487 A1      Oct. 11, 2018

(51) Int. Cl.
*G06N 3/063* (2006.01)
*G11C 11/54* (2006.01)
*G06N 3/08* (2006.01)
*G06N 3/04* (2006.01)
*G11C 13/00* (2006.01)

(52) U.S. Cl.
CPC ......... *G06N 3/0635* (2013.01); *G06N 3/049* (2013.01); *G06N 3/088* (2013.01); *G11C 11/54* (2013.01); *G11C 13/0069* (2013.01); *G06N 3/084* (2013.01); *G11C 2213/32* (2013.01); *G11C 2213/77* (2013.01)

(58) Field of Classification Search
CPC ...... G06N 3/0635; G06N 3/088; G06N 3/049; G06N 3/084; G06N 3/04; G06N 3/063; G11C 11/54; G11C 13/0069; G11C 2213/77; G11C 2213/32
See application file for complete search history.

(56) References Cited

U.S. PATENT DOCUMENTS

| 5,278,636 A | 1/1994 | Williams |
| 7,254,073 B2 | 8/2007 | Rohr |
| 7,781,862 B2 * | 8/2010 | Bertin ............... B82Y 10/00 257/209 |
| 8,294,219 B2 | 10/2012 | Malhotra et al. |
| 8,952,493 B2 | 2/2015 | Mege |

(Continued)

OTHER PUBLICATIONS

R. Diehl et al., "The Crystal Structure of Triclinic WO3," Acta Crystallographica Section B: Structural Crystallography and Crystal Chemistry, vol. 34, No. 4, 1978, pp. 1105-1111.

(Continued)

*Primary Examiner* — Thanh T Nguyen
(74) *Attorney, Agent, or Firm* — Vazken Alexanian; McGinn IP Law Group, PLLC

(57) ABSTRACT

A resistive element in an electrochemical artificial neural network, includes a transition metal oxide thin film forming a working electrode, a pair of first electrodes connected to the working electrode, and a reference electrode for electrochemical doping of the working electrode. The biasing of the pair of first electrodes with respect to the reference electrode according to a determination of conductivity between the pair of first electrodes controls the resistance of the working electrode.

11 Claims, 13 Drawing Sheets

(56) References Cited

U.S. PATENT DOCUMENTS

| | | | |
|---|---|---|---|
| 9,017,937 B1* | 4/2015 | Turner | C12Q 1/6869 |
| | | | 435/6.1 |
| 9,176,357 B2 | 11/2015 | Lam et al. | |
| 9,304,368 B2 | 4/2016 | Yashiro et al. | |
| 9,389,479 B2 | 7/2016 | Lee et al. | |
| 2017/0098156 A1* | 4/2017 | Nino | G06N 3/049 |

OTHER PUBLICATIONS

G. Hollinger et al., "Metal-Nonmetal Transition in Tungsten Bronzes: A photoemission study," Physical Review B, vol. 32, No. 4, 1985, pp. 1987-1991.

C. G. Granqvist, "Electrochromic Tungsten Oxide Films: Review of Progress 1993-1998," Solar Energy Materials and Solar Cells, vol. 60, No. 3, 2000, pp. 201-262.

R. Yang et al., "Synaptic Plasticity and Memory Functions Achieved in a WO3-x-based Nanoionics Device by Using the Principle of Atomic Switch Operation," Nanotechnology, vol. 24, No. 38, 2013, 384003, 9 pages.

T. Chang, "Tungsten Oxide Memristive Devices for Neuromorphic Applications," PhD dissertation, The University of Michigan, 2012.

Elliot J. Fuller et al., "Li-Ion Synaptic Transistor for Low Power Analog Computing", wileyonlinelibrary.com, Advanced Materials, Nov. 22, 2016.

* cited by examiner

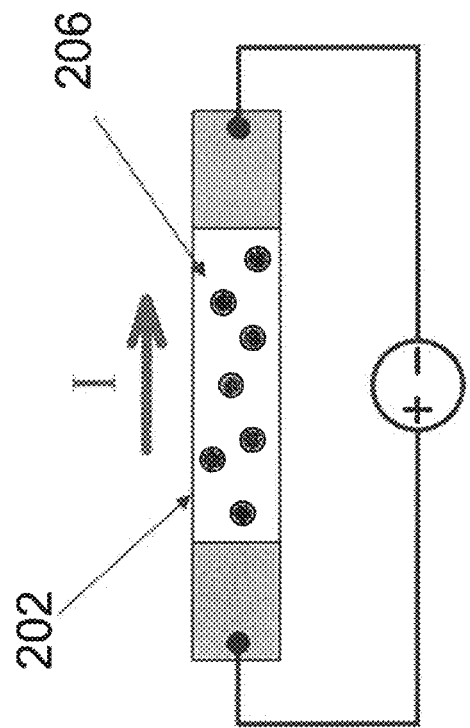
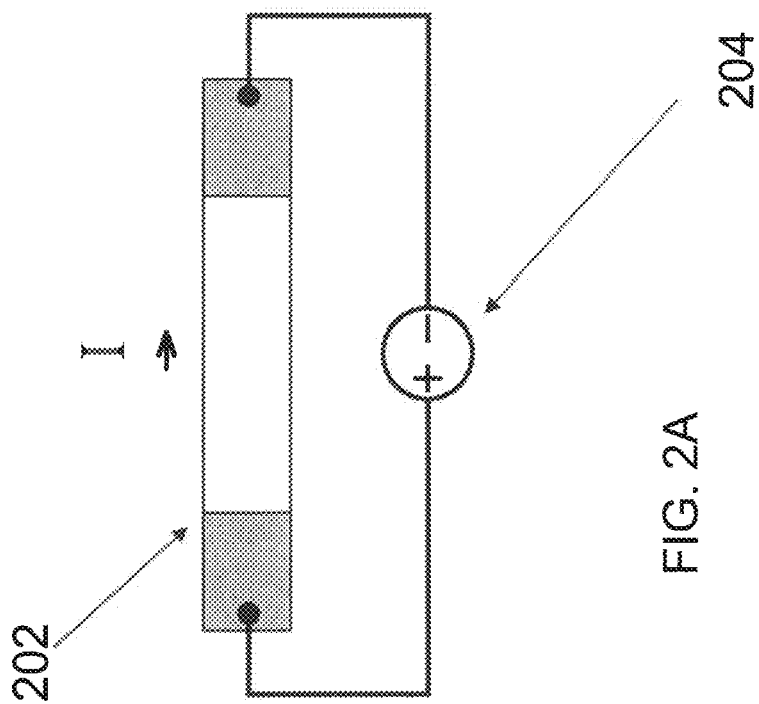
FIG. 2A
FIG. 2B

ARCHITECTURE FOR AN ELECTROCHEMICAL ARTIFICIAL NEURAL NETWORK

BACKGROUND OF THE INVENTION

Field of the Invention

The present invention relates generally to a method and apparatus for artificial neural network, and more particularly, but not by way of limitation, relating to a method, system, and apparatus for an architecture for an electrochemical artificial neural network.

Description of the Related Art

An artificial neural network (ANN) is a network based on biological neural networks which are used to approximate functions that can depend on known inputs. Artificial neural networks can see the nodes as 'artificial neurons'. An artificial neuron is a computational model inspired in the natural neurons. Natural neurons receive signals through synapses located on the dendrites or membrane of the neuron. When the signals received are strong enough (surpass a certain threshold), the neuron is activated and emits a signal through the axon. This signal might be sent to another synapse, and might activate other neurons.

Novel nano-electronic device concepts based on non-volatile memory (NVM) technologies, such as phase change memory (PCM) and resistive random access memory (RRAM), have been explored recently for implementing neural networks with a learning rule inspired by spike-timing-dependent plasticity (STDP) observed in biological systems. All of approaches using previously developed memory technologies looks very promising, however the estimated acceleration factors are limited by device specifications intrinsic to their application as NVM cells.

While there have been electronic devices used for artificial neural networks, there is a need to use a more effective means of providing artificial neural networks than through current electronic elements that are capable of learning.

SUMMARY OF INVENTION

In view of the foregoing and other problems, disadvantages, and drawbacks of the aforementioned background art, an exemplary aspect of the present invention provides a system, apparatus, and method of providing a method, system, and apparatus for an architecture for an electrochemical artificial neural network.

One example aspect of the present invention provides a resistive element in an electrochemical artificial neural network, including a transition metal oxide thin film forming a working electrode, a pair of first electrodes connected to the working electrode, and a reference electrode for electrochemical doping of the working electrode. Biasing of the pair of first electrodes relative to the reference electrode controls a resistance of the working electrode according to a determination of conductivity between the pair of first electrodes.

In another aspect of present invention, there is described a method for forming a resistive element in an electrochemical artificial neural network, including forming a transition metal oxide thin film as a working electrode, forming a pair of first electrodes connected to the working electrode, forming a reference electrode for electrochemical doping of the working electrode, determining conductivity between the pair of first electrodes, and controlling a resistance of the working electrode by biasing the pair of first electrodes or the reference electrode according to a determination of conductivity between the pair of first electrodes.

In yet another exemplary aspect of present invention, there is described a cross point array in an electrochemical artificial neural network, including a three terminal device or a four terminal device formed at each cross point in an array.

The three terminal device includes a first terminal and a second terminal configured to be biased to modulate a resistance of a first transition metal oxide film of the three terminal device according to a determination of conductivity between the first and second terminals, and a third terminal configured as a global reference electrode for electrochemical doping of the first transition metal oxide film.

The four terminal device includes a first and a second terminal configured to measure a resistance of a second transition metal oxide film, a third terminal configured as a global reference electrode for electrochemical doping of a second transition metal oxide film, and a fourth terminal configured as a back contact that is grounded. The third terminal with respect to the fourth terminal is configured to be biased to modulate a resistance of the second transition metal oxide film of the four terminal device according to the measurement of the resistance. The reference electrode is of a same type for each cross point in the array.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

BRIEF DESCRIPTION OF DRAWINGS

The exemplary aspects of the invention will be better understood from the following detailed description of the exemplary embodiments of the invention with reference to the drawings.

FIG. 2A illustrates a control of the resistance.

FIG. 2B illustrates a result of the control of resistance.

DETAILED DESCRIPTION OF A PREFERRED EMBODIMENTS

Figure 1:
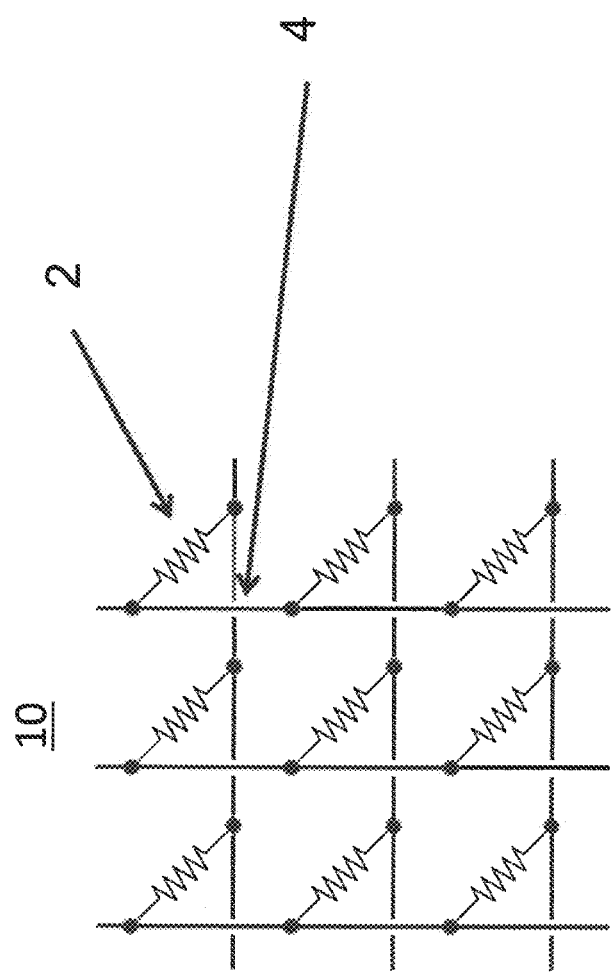
FIG. 1 illustrates a cross point array of the present invention.

The invention will now be described with reference to the drawing figures, in which like reference numerals refer to like parts throughout. It is emphasized that, according to common practice, the various features of the drawing are not necessary to scale. On the contrary, the dimensions of the various features can be arbitrarily expanded or reduced for clarity. Exemplary embodiments are provided below for illustration purposes and do not limit the claims.

An artificial neural network (ANN) is a network based on biological neural networks which are used to approximate functions that can depend on known inputs. Artificial neural networks can see the nodes as 'artificial neurons'. An artificial neuron is a computational model inspired in the natural neurons. Natural neurons receive signals through synapses located on the dendrites or membrane of the neuron. When the signals received are strong enough (surpass a certain threshold), the neuron is activated and emits a signal through the axon. This signal might be sent to another synapse, and might activate other neurons.

A deep neural network (DNN) is an artificial neural network (ANN) with multiple hidden layers of units between the input and output layers. Deep Neural Networks (DNNs) demonstrated significant commercial success in the last years with performance exceeding sophisticated prior methods in speech and object recognition. However, training the DNNs is an extremely computationally intensive task that requires massive computational resources and enormous training time that hinders their further application. For example, a 70% relative improvement has been demonstrated for a DNN with 1 billion connections that was trained on a cluster with 1000 machines for three days. Training the DNNs relies in general on the backpropagation algorithm that is intrinsically local and parallel. Various hardware approaches to accelerate DNN training that are exploiting this locality and parallelism have been explored with a different level of success starting from the early 90s to current developments with GPU, FPGA or specially designed ASIC. Further acceleration is possible by fully utilizing the locality and parallelism of the algorithm. For a fully connected DNN layer that maps neurons to neurons significant acceleration can be achieved by minimizing data movement using local storage and processing of the weight values on the same node and connecting nodes together into a massive systolic array where the whole DNN can fit in. Instead of a usual time complexity, the problem can be reduced therefore to a constant time independent of the array size. However, the addressable problem size is limited to the number of nodes in the array that is challenging to scale up to billions even with the most advanced CMOS technologies. Novel nano-electronic device concepts based on nonvolatile memory (NVM) technologies, such as phase change memory (PCM) and resistive random access memory (RRAM), have been explored recently for implementing neural networks with a learning rule inspired by spike-timing-dependent plasticity (STDP) observed in biological systems.

Only recently, their implementation for acceleration of DNN training using backpropagation algorithm have been considered with reported acceleration factors ranging from 27× to 900×, and even 2140× and significant reduction in power and area. All of these bottom-up approach of using previously developed memory technologies looks very promising, however the estimated acceleration factors are limited by device specifications intrinsic to their application as NVM cells.

Device characteristics usually considered beneficial or irrelevant for memory applications such as high on/off ratio, digital bit-wise storage, and asymmetrical set and reset operations, are becoming limitations for acceleration of DNN training. These non-ideal device characteristics can potentially be compensated with a proper design of peripheral circuits and a whole system, but only partially and with a cost of significantly increased operational time.

As mentioned there has been electronic devices used for artificial neural networks, there has been no use of electrochemical devices used in such networks that are capable of learning.

Specialized kind of hardware is faster than regular computers. One of the ways is to have an object that has a resistance and to reversibly control this resistance and program it by some means. Unlike devices that can have resistance set only once for inferencing purposes, there is a need to be able to change back and forth resistance in order to enable training.

Programming the resistances in artificial neural networks (ANNs) is a very difficult task. The present invention describes several methods that enable the precise programming of resistances by changing the resistivity of metal oxide elements via intercalation. One of the features of the present invention is the ability to program individual resistive elements efficiently.

As mentioned, there has been electronic devices used for artificial neural networks, but there have been few examples of electrochemical devices used in such networks.

The present invention describes methods to program the resistance of metal oxide resistive elements (RE's) used as components in an artificial neural network.

Artificial neural networks (ANNs) can be formed from crossbar arrays of RPUs that provide local data storage and local data processing without the need for additional processing elements beyond the RPU. The trainable resistive crosspoint devices are referred to as resistive processing units (RPUs) or resistive elements (RE's).

Crossbar arrays (crosspoint arrays or crosswire arrays) are high density, low cost circuit architectures used to form a variety of electronic circuits and devices, including ANN architectures, neuromorphic microchips and ultra-high density nonvolatile memory. A basic crossbar array configuration includes a set of conductive row wires and a set of conductive column wires formed to intersect the set of conductive row wires. The intersections between the two sets of wires are separated by so-called crosspoint devices, which may be formed from thin film material.

Crosspoint devices, in effect, function as the ANN's weighted connections between neurons. Nanoscale two-terminal devices, for example memristors having conduction state switching characteristics, are often used as the crosspoint devices in order to emulate synaptic plasticity with high energy efficiency. The conduction state (e.g., resistance) of the memrestive material may be altered by controlling the voltages applied between individual wires of the row and column wires.

The present invention allows for learning where the resistive elements can be changed during a training process and not just changing the resistance once like in inferencing. One of the basic idea is to use a material such as Tungsten Oxide $WO_3$ in which the resistance can be changed over a wide range. For example, this material is transparent when you do not dope the material, but when it is doped with hydrogen, lithium, or other elements, it can be opaque as in automatic dimming rear view mirror (e.g., SMART WINDOWS). However, in the present invention, the controlling of the conductivity is looked at rather than the light transmission qualities of a material.

The present invention deals with controlling how much of an intercalating agent (hydrogen, lithium, etc.) goes into a material such as Tungsten Oxide $WO_3$. Other types of materials can also be used as discussed below. What is included is an electrolyte that allows for ions to move. In an example, there can be Hydrogen ions, where using, for example an acid that breaks apart into a positive and negative part. Then there is added a reference electrode where one can electrochemically control the Hydrogen going into the Tungsten Oxide material by controlling a voltage between the reference electrode and the Tungsten Oxide. For example, if one places a pulse on the reference electrode, then one can change the potential of Tungsten Oxide with respect to the reference electrode. The pulse can drive Hydrogen ions from the electrolyte to combine with an electron in the oxide to change the resistance in the Tungsten Oxide. If the polarity of the pulse is reversed, then the electrons is extracted and a Hydrogen ion enters the electrolyte. The conductivity is measured through the Tungsten Oxide and controlled accordingly. Therefore, at least two electrodes are needed on the Tungsten Oxide for the measurement. The electrolyte can be different examples as discussed in the following.

In the network array, the reference electrode can be same for each resistive element. Therefore, in the array there can be a common reference electrode.

FIG. 1 illustrates a cross point array 10 of the present invention. Referring to FIG. 1, learning requires a network with well-defined resistance for each resistive element 2 at each node 4 that can be changed multiple times. The resistive elements 2 shown in the cross-point array 10 can be programmed for continuous learning.

It has long been realized that artificial neural networks (ANNs) can perform certain pattern recognition tasks faster than traditional CMOS. Most of these networks are "virtual", i.e., they are programmed in a computer. There is a need to find new electronic devices that can perform the artificial neural network tasks. To do this, one needs to be able to change the resistance of a material in a continuous way, both up and down.

The present invention describes a cross point architecture that uses a novel three-terminal device consisting of special metal oxides. These oxides have the property that when foreign atoms are intercalated their resistance changes. Cross point arrays based on oxides with reversible intercalation have not been proposed. It is a novel device concept based on electrochemistry.

The key in ANN is to allow a scheme that enables learning, such as in situ modification of the cross point resistances. This invention describes an electrochemical approach that enables a simple architecture and potentially better control over the resistance compared to current methods.

The present invention describes an artificial neural network with resistive elements (RE's) that are programmed electrochemically. The resistance of the resistive element is controlled by electrochemical doping, using a counter electrode (CE) or reference electrode that is common to all resistive elements. Each resistive element forms a separate working electrode (WE). Doping of a particular resistive element in the network is accomplished by biasing both the bit and word lines relative to the counter electrode. The sign and amplitude of the bias drives dopants either into or out of the electrolyte, changing the resistance of the working electrode. The resistive element should be a material in which doping changes the resistance.

FIG. 2A and FIG. 2B illustrates a control of the resistance. One of the basic ideas is to control resistance via reversible intercalation. Intercalation is the reversible inclusion or insertion of a molecule (or ion) into compounds with layered structures. The resistive element 202 is connected to a power supply 204.

It can be seen that the current I is greater in FIG. 2B than in FIG. 2A. Resistance is high when it is undoped in FIG. 2A and the resistance drops dramatically when intercalated with the dopants 206. Electrochemistry offers potentially precise control of the intercalation process.

Figure 3:
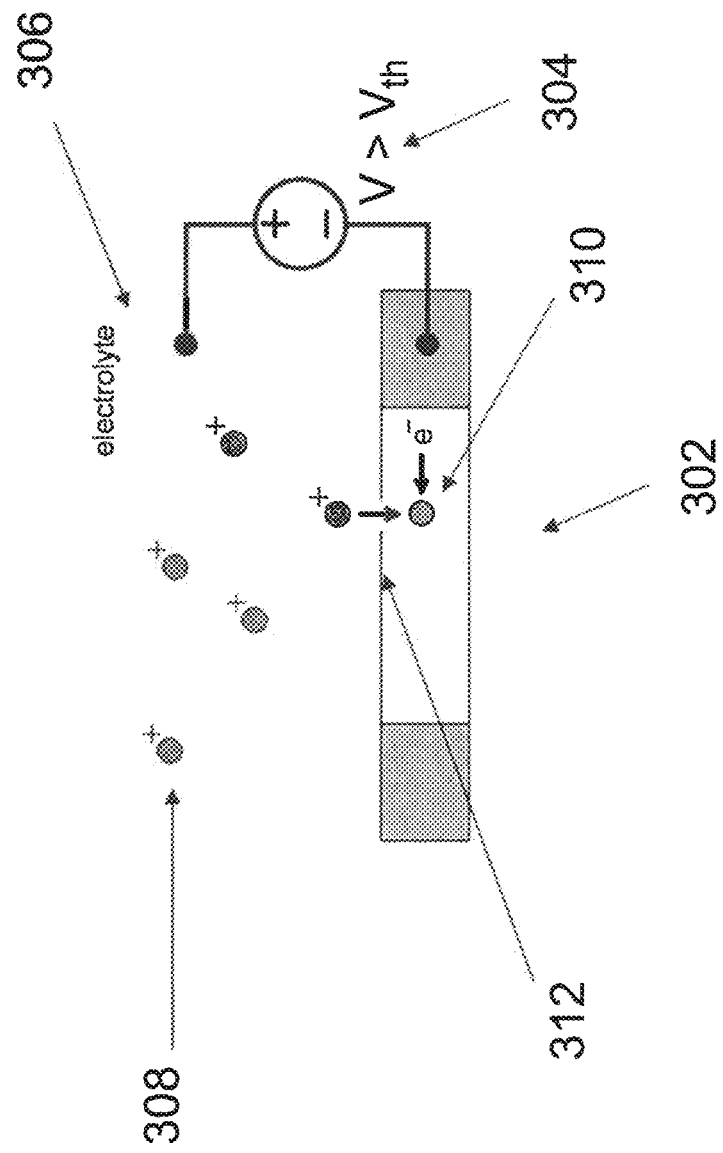
FIG. 3. illustrates electrochemical intercalation.

FIG. 3. illustrates electrochemical intercalation of the present invention. Resistive element 302 is in contact with an electrolyte 306 containing ions 308. The passage of ions 308 in an out of the electrolyte 306 requires a chemical reaction and not just simple ion diffusion. The resistive element 302 is connected to a power supply 304. Bias must exceed a threshold value (V>Vth) in order for chemical reaction to occur rapidly. Both high and low resistance states are effectively thermodynamically stable at a particular bias.

The electrolyte 306 can be an acid in water, but it can also be any electrolyte, including, for example, lithium-based ones and specifically lithium perchlorate in propylene carbonate.

Figure 4:
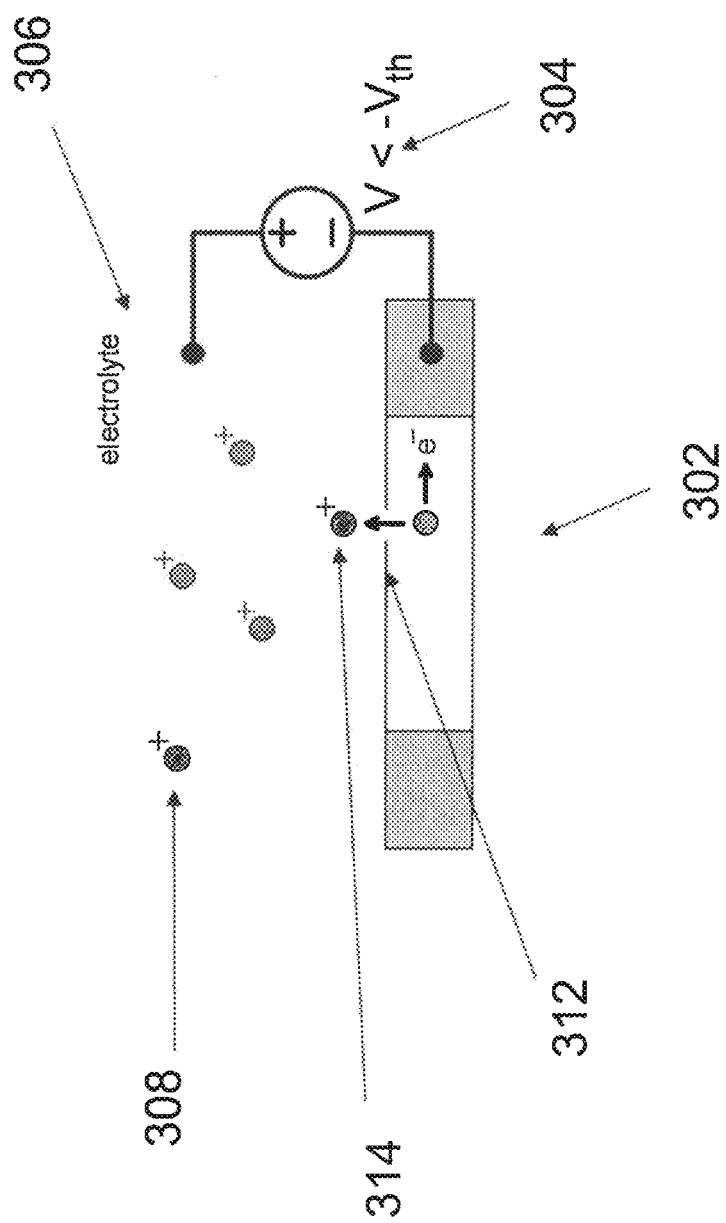
FIG. 4. illustrates electrochemical de-intercalation of the present invention.

FIG. 4. illustrates electrochemical de-intercalation of the present invention. Here, the bias from the power supply 304 is less than a negative polarity of the threshold value (V<−Vth).

Figure 5:
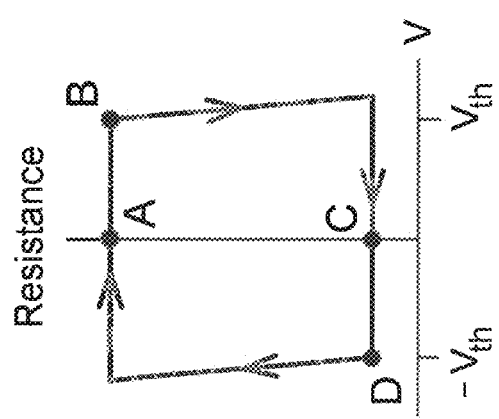
FIG. 5 illustrates an idealized voltage to resistance graph for the resistive elements shown in FIGS. 3 and 4.

FIG. 5 illustrates an idealized resistance versus voltage graph for the resistive elements shown in FIGS. 3 and 4. At point A, there is no bias and there is in a high resistance state where it is undoped. With reference to FIGS. 4 and 5, at point B in the graph, the bias exceeds the threshold Vth, there is reaction at the interface 312, where ions 310 leave the electrolyte 306 and current flows. At point C in the graph of FIG. 5, there is no bias, and the resistive element 302 is in the low resistance state, where it is doped. At point D in the graph of FIG. 5, when the bias exceeds the threshold −Vth, reaction occurs at the interface 312, where ions 314 enter the electrolyte 306.

Figure 6:
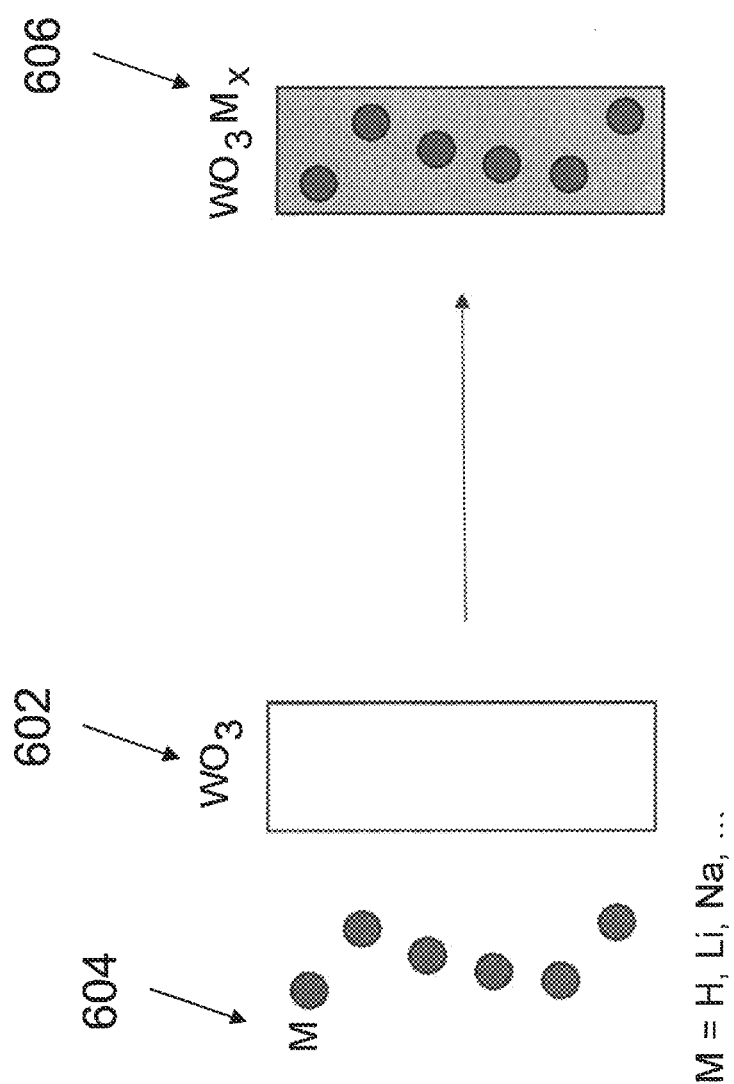
FIG. 6 illustrates some example electrochemical materials that can be used.

FIG. 6 illustrates some example electrochemical materials that can be used. Transparent oxides that become opaque when doped can be used. For example, where M=H, Li, Na, . . . , etc., 604 can be combined with an oxide $WO_3$ 602 to provide an opaque metallic oxide of $WO_3Mx$ 606. Tungsten Oxide $WO_3$ is an example material that can be used, but other material can be used. It can easily be grown through, for example, sputter, MBE, CVD or sol gel.

Figure 7:
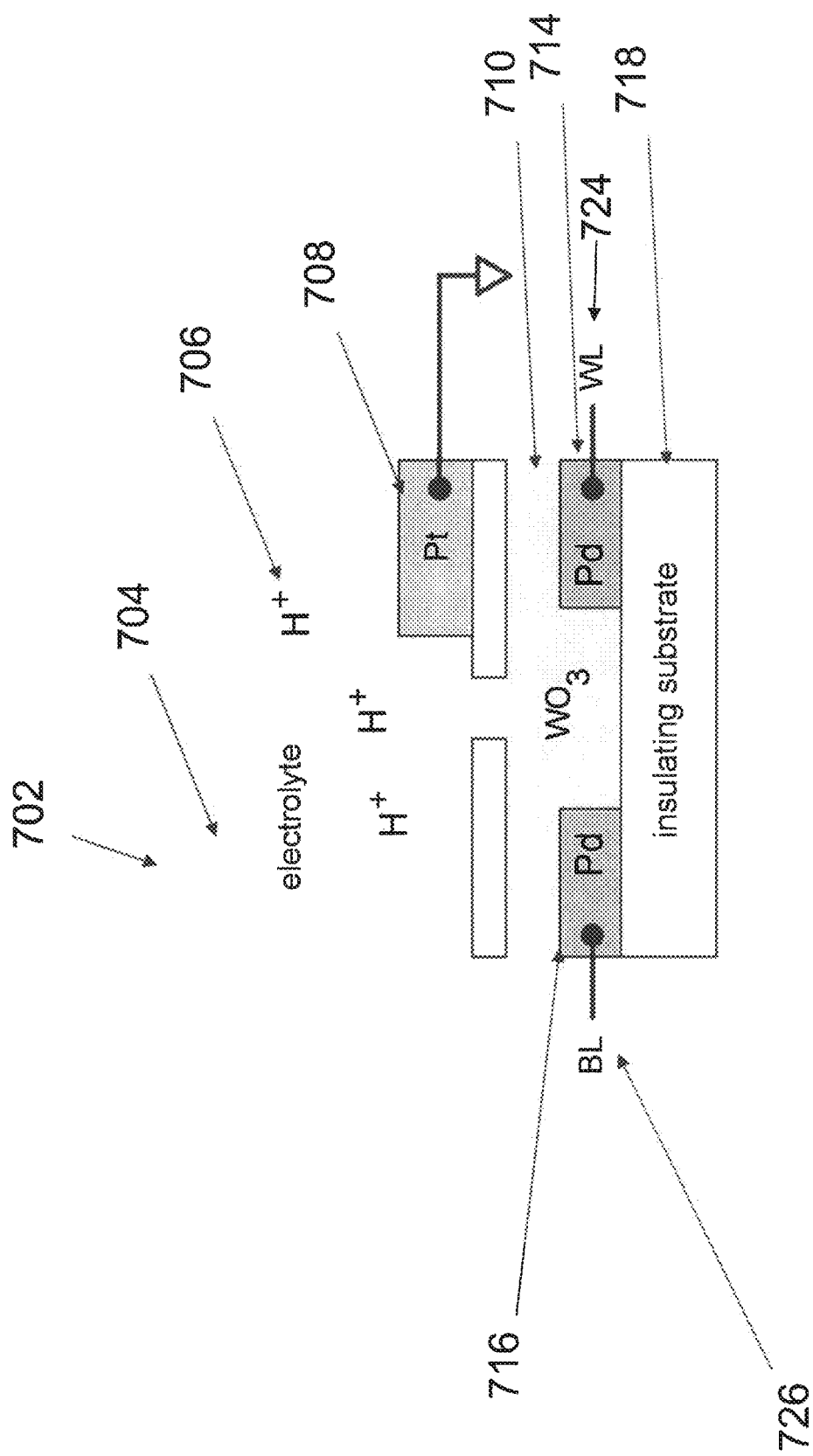
FIG. 7 is a device according to an embodiment of the present invention.

FIG. 7 is a device according to an embodiment of the present invention. There is shown a two terminal cross point element 702. The cross bar would be submerged in an electrolyte 704. A common reference electrode including, for example, Platinum Pt 708. A solid electrolyte is also possible in place of the electrolyte 704. Bias both the bit line BL 726 Palladium (Pd) 716 and the word line WL 724 Palladium (Pd) 714 with respect to reference electrode (Pt) to modify $WO_3$ 710 resistance that is laid on an insulating substrate 718. Negative bias on Palladium Pd 714 and 716 lowers the resistance of the $WO_3$ 710. Positive bias on Palladium Pd 714 and 716 raises the resistance of the $WO_3$ 710.

Figure 8:
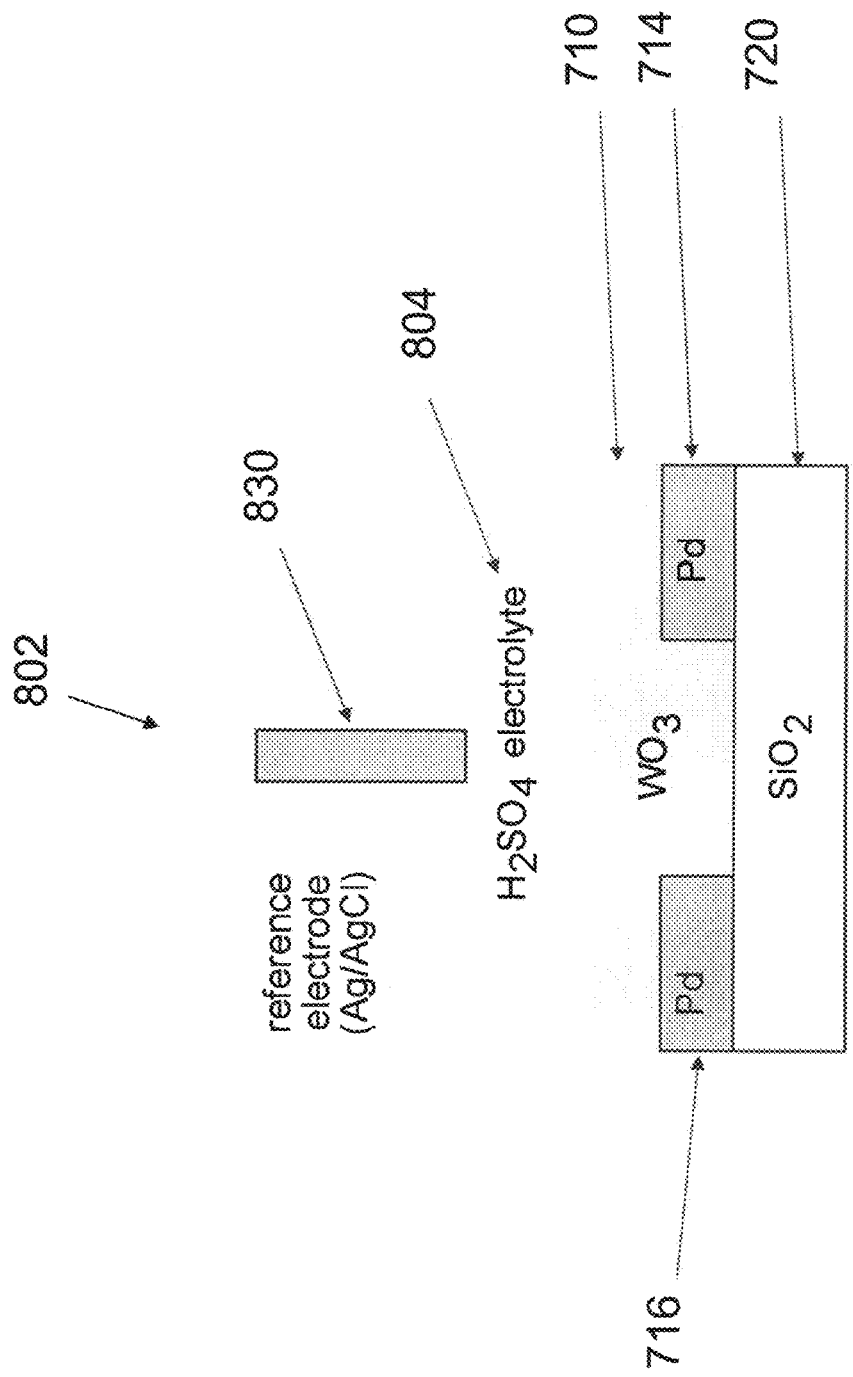
FIG. 8 is another device according to an embodiment of the present invention.
Figure 9:
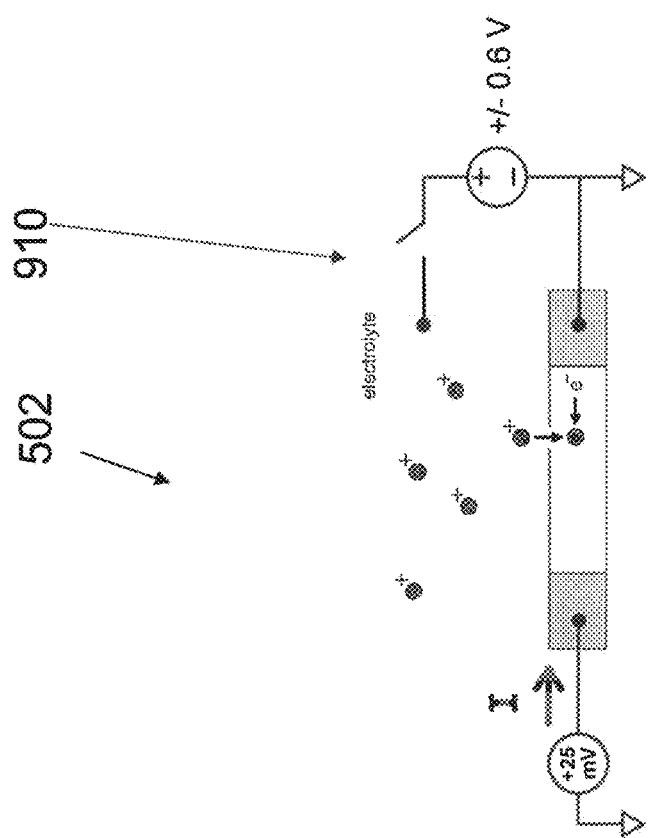
FIG. 9 illustrates the switching element of the device of FIG. 8.

FIG. 8 is another device according to an embodiment of the present invention. The resistance of $WO_3$ can be changed by pulsing Pd pads 714 and 716 with respect to reference electrode Ag/AgCl 830 in the electrolyte $H_2SO_4$ 804. The voltage pulses induce resistance change in $WO_3$. The voltage can be pulsed through a switch 910 as seen in FIG. 9.

Figure 10:
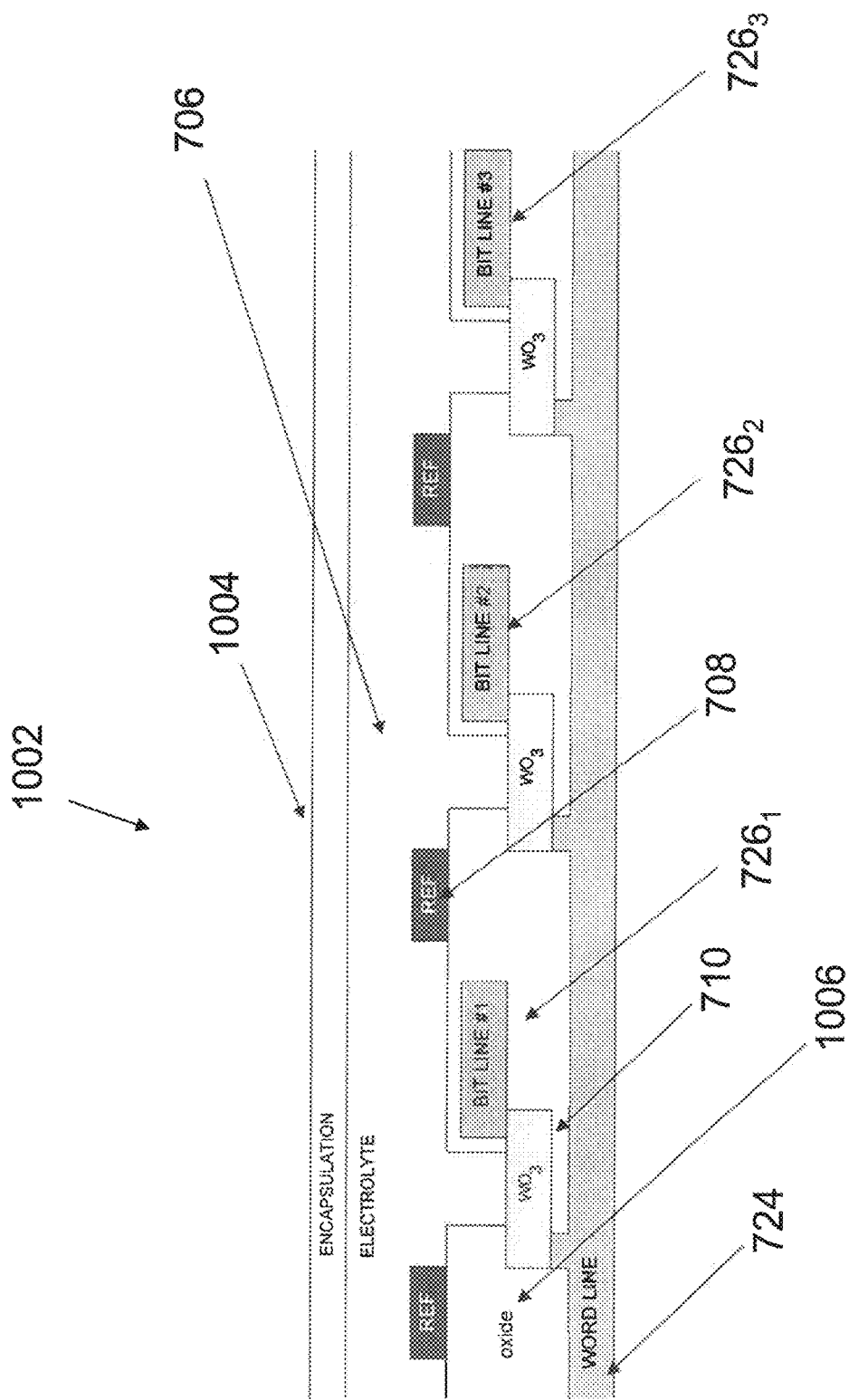
FIG. 10 illustrates a cross point array with $WO_3$ devices.

FIG. 10 illustrates a cross point array 1002 with $WO_3$ devices. The $WO_3$ element 710 connects one bit line 726

(one of $726_1$, $726_2$, $726_3$, . . . $726_n$) to one word line 724. Each WO3 element 710 is exposed to a global (solid) electrolyte 706 containing ions. The electrolyte 706 is also in contact with a global reference electrode 708 which can be grounded. The reference electrodes 708 can be formed at a pitch, but the reference electrodes 708 can also be drawn without a pitch. An encapsulation layer 1004 can also be formed over the electrolyte 706. Additionally, an oxide 1006 can formed between the WO₃ elements 710.

Figure 11:
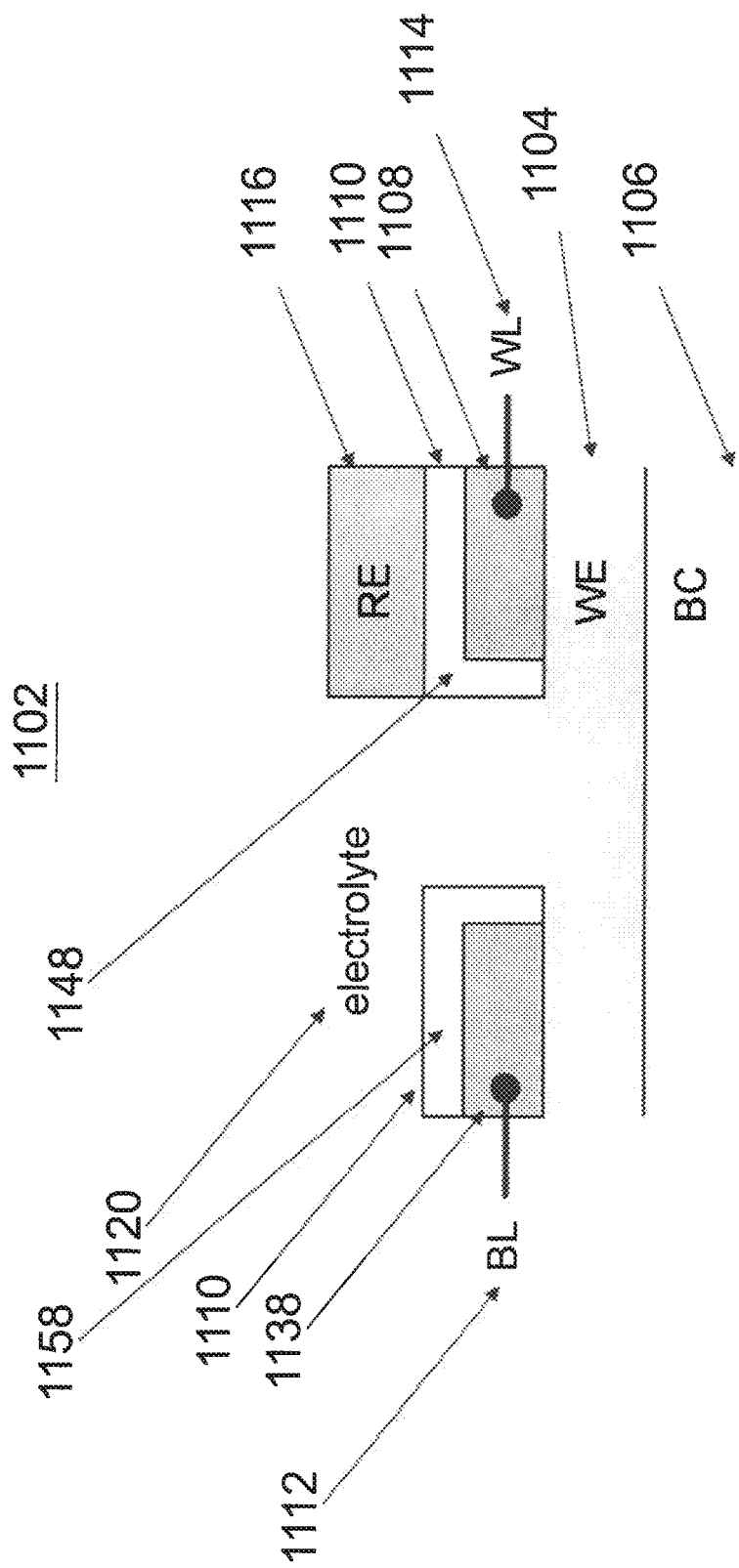
FIG. 11 illustrates a four terminal device of an exemplary embodiment.
Figure 12:
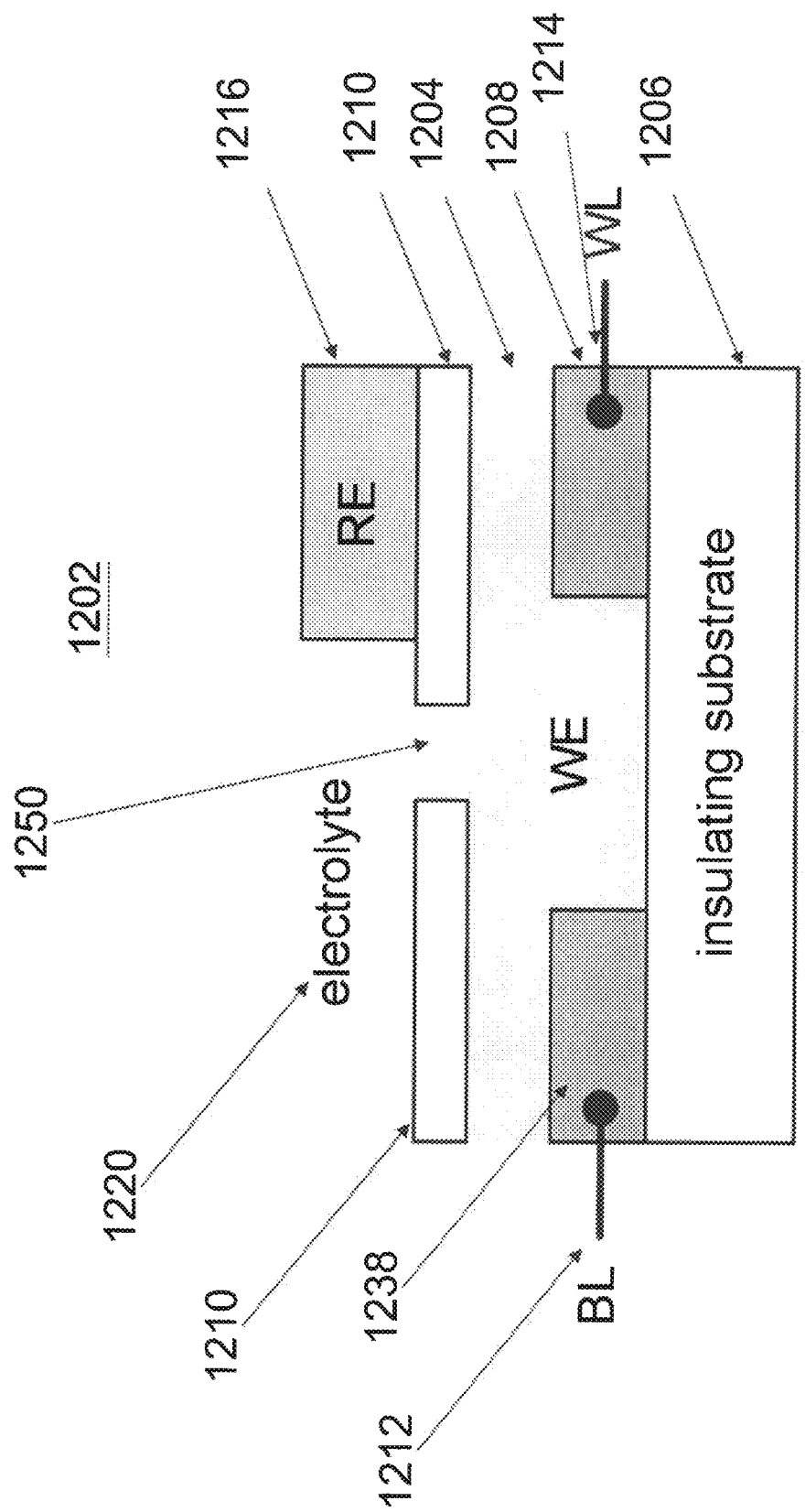
FIG. 12 illustrates a three terminal device of an exemplary embodiment.

FIG. 11 illustrates a four terminal device of an exemplary embodiment and FIG. 12 illustrates a three terminal device of an exemplary embodiment. The present invention describes a structure and method that enables the electrical resistance between two terminals to be controlled by biasing a third terminal. Two example structures are shown with a three-terminal device, and a four-terminal device. Additional terminals can also be provided.

Referring to FIG. 11, a thin film of the working electrode (WE) material 1104 is deposited onto a conducting back contact (BC) 1106, which could be, for example, a doped Si wafer. The working electrode WE 1104 is a material in which the resistance can be modulated via electrochemical doping. One example of the working electrode WE 1104 is a metal oxide or a transition metal oxide such as WO₃. Then, contacts (e.g., Palladium Pd) 1108 and 1138 are deposited onto the working electrode WE 1104. The contacts 1108 1138 are then encapsulated in an insulating layer (e.g. SiO₂) 1110. In FIG. 11, the contacts 1138 and 1108 are labeled with a connection to a BL (bit line) 1112 and WL (word line) 1114, respectively, to indicate how the four terminal device 1102 could form an element in a cross point array.

The state of the four terminal device 1102 is sensed by applying a voltage drop across the bit line BL 1112 and word line WL 1114 terminals. The current is determined by the resistance of the working electrode WE 1104 between the electrodes (i.e., contacts 1138 and 1108). A reference electrode (RE) 1116 is formed on top of the insulated electrodes 1148 and 1158, where the insulated electrodes 1148 and 1158 each comprise the contacts 1138, 1108 and the insulating layer 1110.

In one embodiment, the reference electrode RE 1116 can be, for example, platinum Pt. The structure is placed in an electrolyte 1120 that contains free ions but does not allow direct conduction of electrons. One example is an aqueous solution of sulfuric acid $H_2SO_4$. The doping of the working electrode WE 1104 can be controlled by an electrochemical bias.

The following scheme can be applied to a WO3 WE 1104, but is similar for other materials. When the reference electrode RE 1116 is biased positively (e.g., +1 V) with respect to the back contact BC 1106, positive ions flow into the working electrode WE 1104 from the electrolyte 1120, lowering the resistance. Alternatively, when the reference electrode RE 1116 is biased negatively (e.g., −1 V) with respect to the back contact BC 1106, positive ions flow out of the working electrode WE 1104 and into the electrolyte 1120, increasing the resistance.

If current is not allowed to flow through the reference electrode RE 1116, the resistance of the four terminal device 1102 cannot be changed. To summarize, if the back contact BC 1106 is grounded, then positive voltage pulses on the reference electrode RE 1116 will lower the resistance and negative pulses will increase it.

Referring to FIG. 12, the three-terminal device 1202 is similar to the four-terminal device 1102, but requires biasing the bit line BL 1212 and the word line WL 1214 to modulate the resistance. The bit line BL 1212 electrode 1238 and word line WL 1214 electrode 1208 are formed on an insulating substrate 1206. The bit line BL 1212 and word line WL 1214 electrodes 1238 and 1208 can be of the same material. The working electrode WE 1204 is deposited on top of the bit line BL and word line WL electrodes 1238 and 1208.

The working electrode WE 1204 can be, for example, a metal oxide or a transition metal oxide such as WO₃. As in the four-terminal device 1102, the state of the three-terminal device 1202 is determined by the resistance of the working electrode WE 1204 between the bit line BL and word line WL electrodes 1238 and 1208. An insulating layer 1210 is deposited on top of the working electrode WE 1204.

The insulating layer 1210 is patterned so that the electrolyte 1220 has access to the working electrode WE 1204 at well-defined positions, such as the access opening 1250. The working electrode WE 1204 will be doped by the passage of ions through this access opening 1250. The reference electrode RE 1216 is deposited on top of the insulating layer 1210.

The structure of the three-terminal device 1202 is placed in an electrolyte 1220 as described above. The pulse scheme to modulate the doping in the three-terminal device 1202 is different from the pulse scheme used in the four-terminal device 1102. In the pulse scheme of the three-terminal device 1202, the reference terminal RE 1216 is grounded. A negative pulse on both the bit line BL 1212 and word line WL 1214 will cause positive ions to flow into the working electrode WE 1204, lowering the resistance in the working electrode 1204.

A positive pulse on both the bit line BL 1212 and word line WL 1214 will cause ions to flow from the working electrode WE 1204 back into the electrolyte 1220, increasing the resistance in the working electrode WE 1204. A negative pulse on the bit line BL 1212 and positive pulse on the word line WL 1214 (or vice versa) will not, to first order, cause a change in doping (average potential in the WE will be zero).

Figure 13:
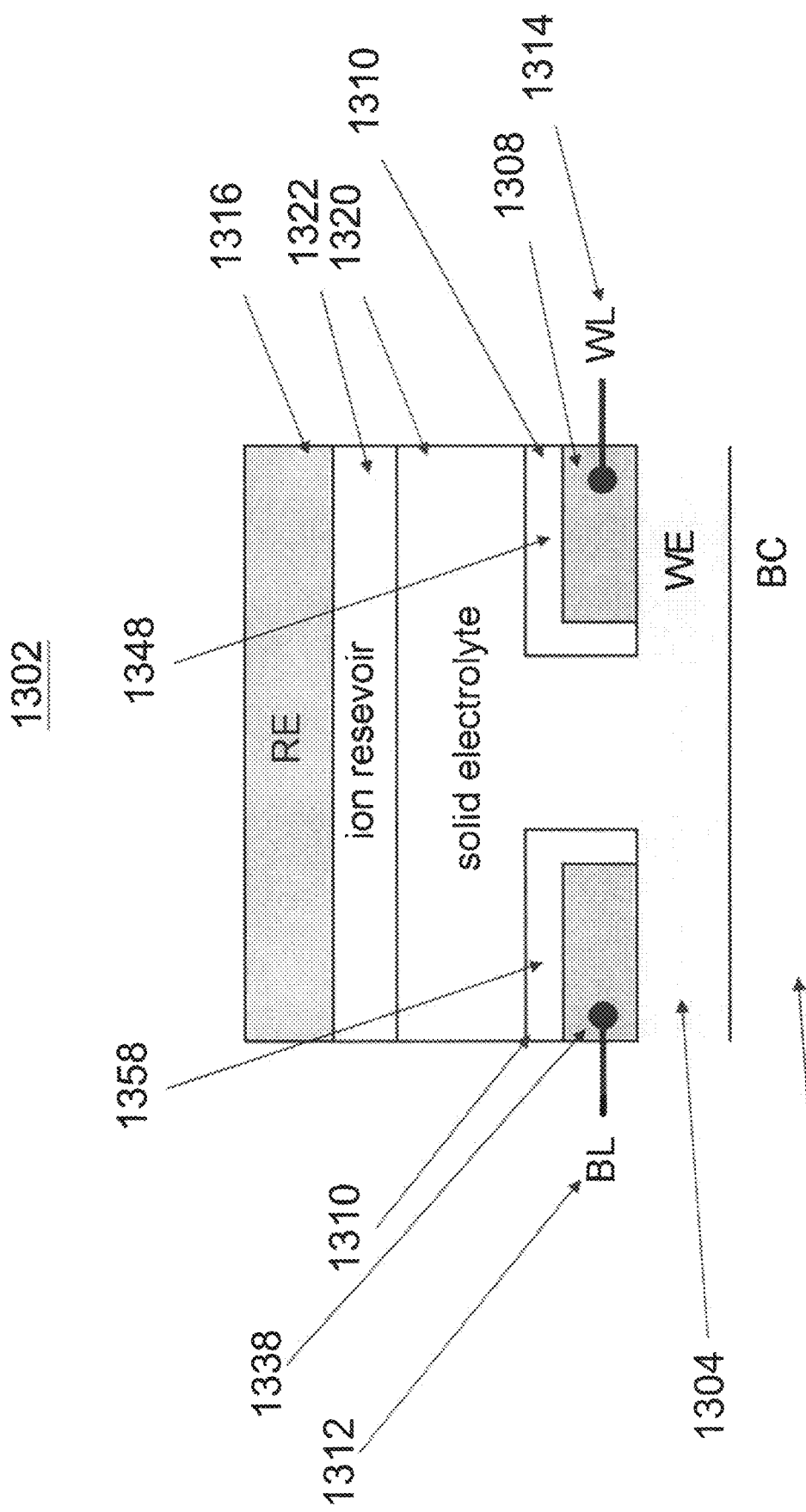
FIG. 13 illustrates a device with a solid electrolyte of an exemplary embodiment.

FIG. 13 illustrates a solid electrolyte four-terminal device 1302 of an exemplary embodiment. The schemes described above are best suited for liquid electrolytes that contain dispersed ions. Solid electrolytes (or proton conductors) 1320 can also be used, with slight increase in complexity. The liquid electrolyte is replaced by a solid electrolyte 1320 that conductions positive ions but not electrons. A reservoir of ions 1320 is then needed to supply ions to (and consume from) the word line WE 1314. The ion reservoir 1322 could have similar properties to the working electrode WE 1304.

A thin film of the working electrode (WE) material 1304 is deposited onto a conducting back contact (BC) 1306, which could be, for example, a doped Si wafer. The working electrode WE 1304 is a material in which the resistance can be modulated via electrochemical doping. One of the working electrode WE 1304 can be a metal oxide or a transition metal oxide such as Tungsten trioxide, WO₃. Then, contacts (e.g., Palladium Pd) 1308 and 1338 are deposited onto the working electrode WE 1304. The contacts 1308, 1338 are then encapsulated in an insulating layer (e.g. SiO₂) 1310. In FIG. 13, the contacts 1338 and 1308 are labeled with a connection to a BL (bit line) 1312 and WL (word line) 1314, respectively, to indicate how the four terminal device 1302 with a solid electrolyte 1230 and ion reservoir 1322 could form an element in a cross point array.

The state of the four terminal device 1302 with solid electrolyte 1320 is sensed by applying a voltage drop across the bit line BL 1312 and word line WL 1314 terminals. The current is determined by the resistance of the working electrode WE 1304 between the electrodes (i.e., contacts 1338 and 1308). A reference electrode (RE) 1316 is formed on top of the insulated electrodes 1348 and 1358, where the insulated electrodes 1348 and 1358 each comprise the contacts 1338, 1308 and the insulating layer 1310. In one embodiment, the reference electrode RE 1316 can be, for example, platinum Pt.

The structure of the solid electrolyte four-terminal device is placed with the solid electrolyte 1320 that conductions positive ions but not electrons. The reservoir of ions 1320 is then needed to supply ions to (and consume from) the word line WE 1314.

The doping of the working electrode WE 1304 can be controlled by an electrochemical bias. The following scheme can be applied to a $WO_3$ WE 1304, but is similar for other materials. When the reference electrode RE 1316 is biased positively (e.g., +1 V) with respect to the back contact BC 1306, positive ions flow into the working electrode WE 1104 from the ion reservoir 1322, lowering the resistance. Alternatively, when the reference electrode RE 1316 is biased negatively (e.g., −1 V) with respect to the back contact BC 1306, positive ions flow out of the working electrode WE 1304 and into the electrolyte 1320, increasing the resistance.

If current is not allowed to flow through the reference electrode RE 1316, the resistance of the solid electrolyte four terminal device 1302 cannot be changed. To summarize, if the back contact BC 1306 is grounded, then positive voltage pulses on the reference electrode RE 1316 will lower the resistance and negative pulses will increase it.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

It is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

What is claimed is:

1. A resistive element in an electrochemical artificial neural network, comprising:
   a transition metal oxide thin film forming a working electrode;
   a pair of first electrodes connected to the working electrode; and
   a reference electrode for electrochemical intercalation of the working electrode,
   wherein biasing of the pair of first electrodes or the reference electrode according to a determination of conductivity between the pair of first electrodes controls a resistance of the working electrode.

2. The resistive element according to claim 1, further comprising a conducting back contact layer on which the working electrode is formed,
   wherein the reference electrode is biased with respect to the conducting back contact layer to modulate the resistance of the working electrode.

3. The resistive element according to claim 2, wherein the resistance of the working electrode is modulated between two states by applying a positive pulse or a negative pulse to reference electrode with respect to the conducting back contact layer.

4. The resistive element according to claim 1, wherein the resistance of the working electrode is modulated between two states by applying either positive pulses or negative pulses to both of the pair of first electrodes.

5. The resistive element according to claim 1, further comprising an insulating substrate on which the pair of first electrodes are formed on.

6. The resistive element according to claim 3, wherein the working electrode is formed on the pair of first electrodes and the insulating substrate.

7. The resistive element according to claim 1, further comprising an electrolyte in contact with the reference electrode and the working electrode, the electrolyte comprising an aqueous solution including free ions, but prohibiting direct conduction of electrons.

8. The resistive element according to claim 1, further comprising an electrolyte in contact with the reference electrode and the working electrode,
   wherein the electrolyte comprises a solid electrolyte.

9. The resistive element according to claim 1, wherein the working electrode is formed on the pair of first electrodes and the insulating substrate, and
   wherein the electrolyte comprises a lithium based electrolyte including lithium perchlorate in propylene carbonate.

10. A cross point array, comprising the resistive element according to claim 1 being formed at each cross point in an array,
    wherein the reference electrode is of a same type for each cross point.

11. A cross point array in an electrochemical artificial neural network, comprising:
    a three terminal device or a four terminal device formed at each cross point in an array,
    wherein the three terminal device comprises:
        a first terminal and a second terminal configured to be biased to modulate a resistance of a first transition metal oxide film of the three terminal device according to a determination of conductivity between the first and second terminals; and
        a third terminal configured as a global reference electrode for electrochemical doping of the first transition metal oxide film, and
    wherein the four terminal device comprises:
        a first and a second terminal configured to measure a resistance of a second transition metal oxide film;
        a third terminal configured as a global reference electrode for electrochemical doping of a second transition metal oxide film; and
        a fourth terminal configured as a back contact that is grounded,
        wherein the third terminal with respect to the fourth terminal is configured to be biased to modulate a resistance of the second transition metal oxide film of the four terminal device according to the measurement of the resistance,
wherein the reference electrode is of a same type for each cross point in the array.

* * * * *